US010840877B2

(12) United States Patent
Takamine

(10) Patent No.: US 10,840,877 B2
(45) Date of Patent: Nov. 17, 2020

(54) COMPOSITE FILTER DEVICE, HIGH-FREQUENCY FRONT END CIRCUIT, AND COMMUNICATION APPARATUS

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 4 days.

(21) Appl. No.: 16/151,368

(22) Filed: Oct. 4, 2018

(65) Prior Publication Data
US 2019/0044496 A1  Feb. 7, 2019

Related U.S. Application Data

(63) Continuation of application No. PCT/JP2017/001269, filed on Jan. 16, 2017.

(30) Foreign Application Priority Data

Apr. 11, 2016 (JP) .................... 2016-078644

(51) Int. Cl.
H03H 9/02 (2006.01)
H03H 9/05 (2006.01)
(Continued)

(52) U.S. Cl.
CPC ........ H03H 9/02913 (2013.01); H03H 9/059 (2013.01); H03H 9/0576 (2013.01); H03H 9/1092 (2013.01); H03H 9/25 (2013.01); H03H 9/6483 (2013.01); H03H 9/725 (2013.01); H04B 1/40 (2013.01); H04B 1/50 (2013.01);
(Continued)

(58) Field of Classification Search
CPC combination set(s) only.
See application file for complete search history.

(56) References Cited

U.S. PATENT DOCUMENTS

2004/0116098 A1 * 6/2004 Ochii et al.
2006/0197630 A1 * 9/2006 Fuse .................... H03H 9/0576
333/133

(Continued)

FOREIGN PATENT DOCUMENTS

JP 06-152310 A 5/1994
JP 11-340781 A 12/1999
(Continued)

OTHER PUBLICATIONS

Official Communication issued in International Patent Application No. PCT/JP2017/001269, dated Apr. 4, 2017.

Primary Examiner — Andrew Lai
Assistant Examiner — Mohammed M Murshid
(74) Attorney, Agent, or Firm — Keating & Bennett, LLP

(57) ABSTRACT

A composite filter device includes a common terminal disposed on an element substrate including a piezoelectric layer, first and second band pass filters disposed on the element substrate, and connected at one end thereof to the common terminal, a shield electrode interposed between a signal line and the first band pass filter, the signal line being disposed on the element substrate and connecting the common terminal to the first and second band pass filters, and an inductor connected between the shield electrode and a reference potential line.

18 Claims, 8 Drawing Sheets

(51) Int. Cl.

| | |
|---|---|
| *H03H 9/10* | (2006.01) |
| *H03H 9/25* | (2006.01) |
| *H03H 9/64* | (2006.01) |
| *H03H 9/72* | (2006.01) |
| *H04L 5/14* | (2006.01) |
| *H04B 1/50* | (2006.01) |
| *H04B 1/40* | (2015.01) |
| *H04B 1/00* | (2006.01) |

(52) U.S. Cl.
CPC ....... *H04L 5/1461* (2013.01); *H03H 9/02952* (2013.01); *H04B 1/0057* (2013.01)

(56) References Cited

U.S. PATENT DOCUMENTS

| | | | |
|---|---|---|---|
| 2008/0136559 A1* | 6/2008 | Takahashi et al. | |
| 2009/0058555 A1* | 3/2009 | Takata et al. | |
| 2010/0026414 A1* | 2/2010 | Iwaki et al. | |
| 2010/0194488 A1 | 8/2010 | Yoshimoto | |
| 2011/0228713 A1* | 9/2011 | Alexopoulos et al. | |
| 2014/0113571 A1* | 4/2014 | Fujiwara | H03H 9/6433 455/73 |
| 2017/0093374 A1* | 3/2017 | Yatsenko et al. | |

FOREIGN PATENT DOCUMENTS

| | | |
|---|---|---|
| JP | 2010-178306 A | 8/2010 |
| JP | 6185057 B2 | 4/2013 |
| JP | 2014-082609 A | 5/2014 |
| WO | 2005/011114 A1 | 2/2005 |

\* cited by examiner

COMPOSITE FILTER DEVICE, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2016-078644 filed on Apr. 11, 2016 and is a Continuation Application of PCT Application No. PCT/JP2017/001269 filed on Jan. 16, 2017. The entire contents of each application are hereby incorporated herein by reference.

BACKGROUND OF THE INVENTION

1. Field of the Invention

The present invention relates to a composite filter device, a high-frequency front end circuit, and a communication apparatus that include a plurality of band pass filters connected at one end thereof to a common terminal.

2. Description of the Related Art

Various composite filter devices have been proposed, in which a plurality of filters are connected at one end thereof to an antenna terminal. For example, in a duplexer described in Japanese Unexamined Patent Application Publication No. 11-340781, a shield electrode is interposed between a first band pass filter and a second band pass filter. The shield electrode is electrically connected to a ground electrode of the first band pass filter and to a ground electrode of the second band pass filter.

When the shield electrode is configured as described in Japanese Unexamined Patent Application Publication No. 11-340781, capacitive coupling formed between the shield electrode and acoustic wave resonators of one of the band pass filters may cause high-frequency current to flow into the shield electrode. Therefore, if the shield electrode is shared with the ground potential of the other band pass filter, the high-frequency current may flow through the ground potential into the other band pass filter. This leads to deterioration of isolation.

SUMMARY OF THE INVENTION

Preferred embodiments of the present invention provide composite filter devices, high-frequency front end circuits, and communication apparatuses that achieve improved isolation between first and second band pass filters.

A composite filter device according to a preferred embodiment of the present invention includes an element substrate including a piezoelectric layer; a common terminal disposed on the element substrate; a first band pass filter connected at one end thereof to the common terminal, disposed on the element substrate, and including an acoustic wave resonator; a second band pass filter connected at one end thereof to the common terminal, disposed on the element substrate, and including an acoustic wave resonator; a signal line disposed on the element substrate and connecting the one ends of the first and second band pass filters to the common terminal; a reference potential line disposed on the element substrate and connected to the second band pass filter; a shield electrode disposed on the element substrate, interposed between the signal line and the first band pass filter, and electrically connected to the reference potential line; and an inductor electrically connected between the shield electrode and the reference potential line.

In a composite filter device according to a preferred embodiment of the present invention, the signal line is disposed opposite to the second band pass filter, with the first band pass filter interposed therebetween.

In a composite filter device according to a preferred embodiment of the present invention, the first band pass filter includes a plurality of acoustic wave resonators.

In a composite filter device according to a preferred embodiment of the present invention, the plurality of acoustic wave resonators include series arm resonators and parallel arm resonators, and the first band pass filter is a ladder filter. This effectively reduces the influence of capacitive coupling between the shield electrode and the series arm resonators and parallel arm resonators.

In a composite filter device according to a preferred embodiment of the present invention, the shield electrode is belt-shaped and made of a metal film. In this case, the shield electrode is able to be easily produced by forming the metal film, together with electrodes of the acoustic wave resonators and the signal line.

In a composite filter device according to a preferred embodiment of the present invention, the composite filter device further includes a multilayer substrate, and the element substrate including the first and second band pass filters thereon is mounted on the multilayer substrate.

In a composite filter device according to a preferred embodiment of the present invention, the inductor is disposed in the multilayer substrate. In this case, the inductor is able to be provided without causing an increase in the size of the composite filter device. Also, an inductor with a large inductance value is able to be easily provided.

In a composite filter device according to a preferred embodiment of the present invention, the inductor includes a metal film. In this case, an inductor with a desired inductance value is able to be easily provided.

In a composite filter device according to a preferred embodiment of the present invention, the inductor is a chip inductor.

In a composite filter device according to a preferred embodiment of the present invention, the composite filter device further includes a plurality of bumps joining the element substrate to the multilayer substrate, the shield electrode is connected to at least one of the bumps, and the at least one bump is connected to the inductor disposed in the multilayer substrate.

In a composite filter device according to a preferred embodiment of the present invention, the common terminal is an antenna terminal.

In a composite filter device according to a preferred embodiment of the present invention, one end of at least one other band pass filter is connected to the common terminal to define a composite filter device for carrier aggregation.

In a composite filter device according to a preferred embodiment of the present invention, the first band pass filter and the second band pass filter define and function as a transmit filter and a receive filter, respectively, to define a duplexer. In this case, the isolation characteristics between the transmit filter and the receive filter are able to be effectively improved.

A high-frequency front end circuit according to a preferred embodiment of the present invention includes a composite filter device according to a preferred embodiment of the present invention and at least one of a switch, a power amplifier, an LNA, a diplexer, a circulator, and an isolator.

A communication apparatus according to a preferred embodiment of the present invention includes a high-frequency front end circuit according to a preferred embodiment of the present invention and an RFIC.

The composite filter devices, the high-frequency front end circuits, and the communication apparatuses according to preferred embodiments of the present invention effectively improve the isolation characteristics between the first band pass filter and the second band pass filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Note that the preferred embodiments described in the present specification are merely for illustrative purposes, and some of components described in different preferred embodiments may be replaced or combined.

Figure 1:
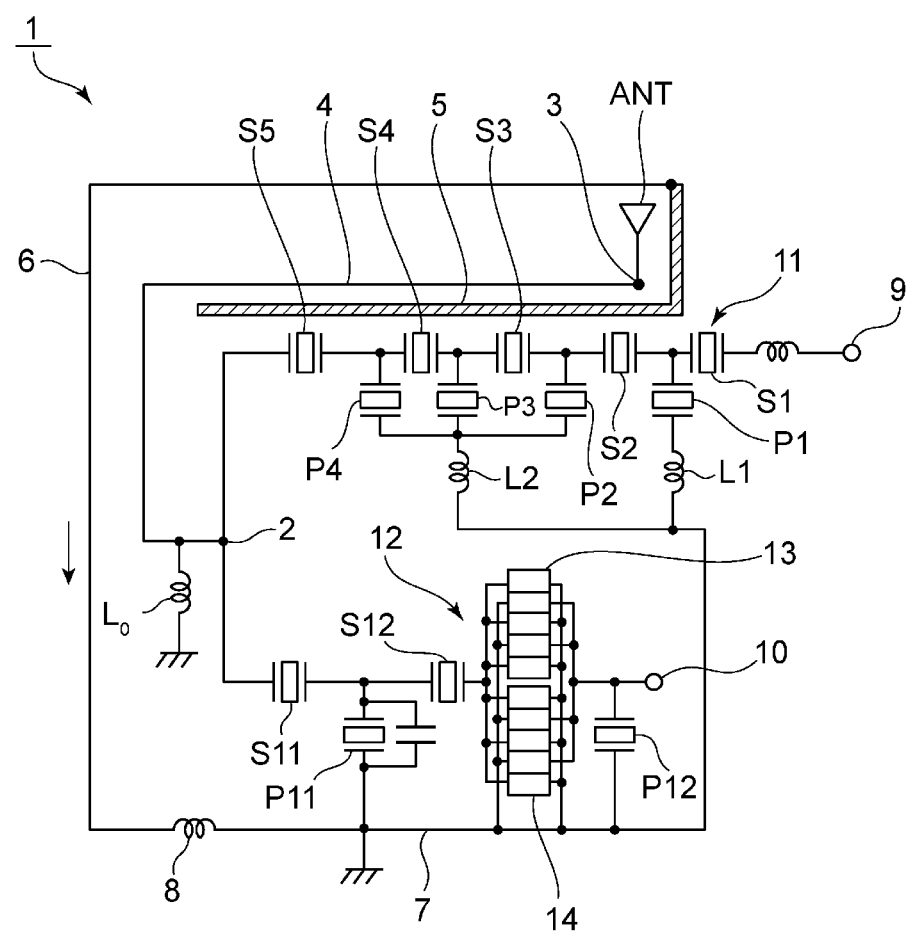
FIG. 1 is a circuit diagram of a composite filter device according to a first preferred embodiment of the present invention.
Figure 2:
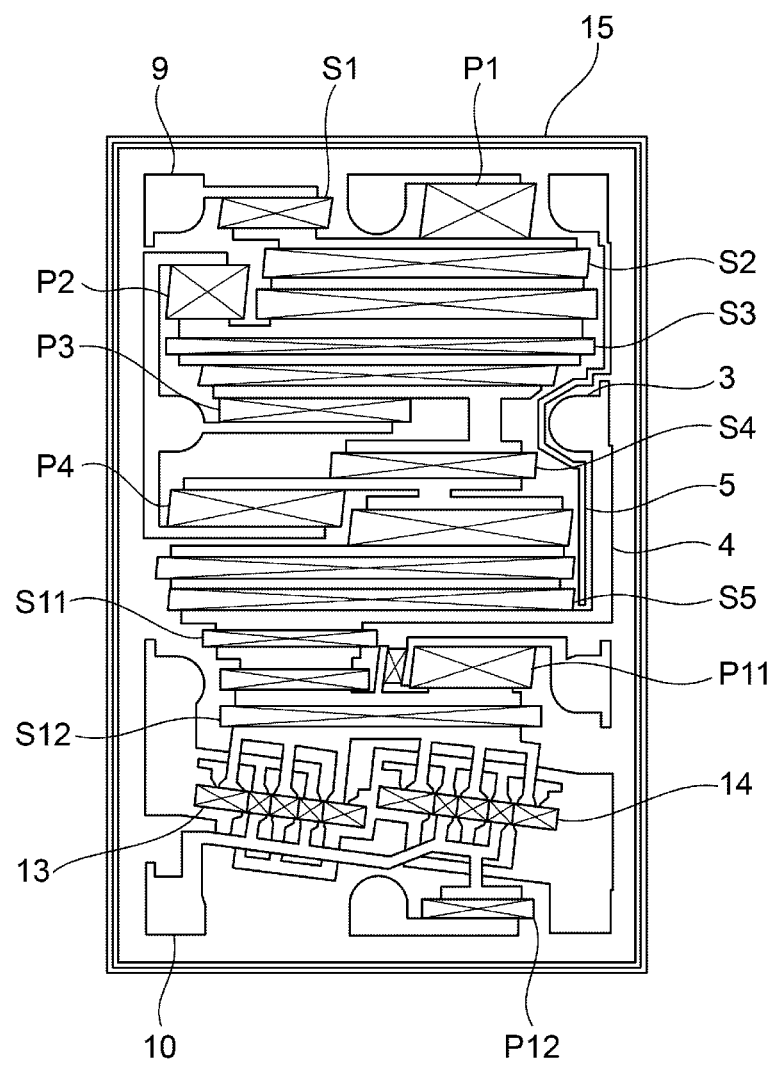
FIG. 2 is a schematic plan view of the composite filter device according to the first preferred embodiment of the present invention.

FIG. 1 is a circuit diagram of a composite filter device according to a first preferred embodiment of the present invention, and FIG. 2 is a schematic plan view of the composite filter device.

A composite filter device 1 is preferably an unbalanced duplexer used for Band 25, for example. In Band 25, the pass band of a transmit filter ranges from about 1850 MHz to about 1915 MHz, and the pass band of a receive filter ranges from about 1930 MHz to about 1995 MHz.

Note that composite filter devices of preferred embodiments of the present invention are not limited to the duplexer for Band 25. As described below, preferred embodiments of the present invention are widely applicable to composite filter devices in which first and second band pass filters are connected at one end thereof to a common terminal.

As illustrated in FIG. 1, the composite filter device 1 includes a first band pass filter 11 and a second band pass filter 12. The first band pass filter 11 is a transmit filter and the second band pass filter 12 is a receive filter. One end of the first band pass filter 11 and one end of the second band pass filter 12 are connected in common to a node 2, which is connected to a common terminal 3. The common terminal 3 is an antenna common terminal to which an antenna ANT is connected. A signal line 4 is provided to connect the common terminal 3 to first ends of the first and second band pass filters 11 and 12. The signal line 4 is disposed opposite to the second band pass filter 12, with the first band pass filter 11 interposed therebetween.

A shield electrode 5 provides electromagnetic shielding between the first band pass filter 11 and the signal line 4. The shield electrode 5 is connected to a connection line 6. The connection line 6 is connected to a reference potential line 7. The reference potential line 7 connected between one end portions at the reference potential side of a parallel arm resonator P11 and P12, and a first and a second longitudinally coupled resonator elastic wave filters 13 and 14 including the second band pass filter 12, is connected to a reference potential.

In the composite filter device 1, an inductor 8 is electrically connected between the shield electrode 5 and the reference potential line 7. This connection of the inductor 8 improves the isolation characteristics between the first band pass filter 11 and the second band pass filter 12. The fact that the inductor 8 is electrically connected between the shield electrode 5 and the reference potential line 7 does not mean that the inductor 8 is physically connected between the shield electrode 5 and the reference potential line 7, but means that the inductor 8 is electrically connected at one end thereof to the shield electrode 5 and electrically connected at the other end thereof to the reference potential line 7.

A more detailed description of the composite filter device 1 will now be provided.

The first band pass filter 11 is connected at one end thereof to the common terminal 3, and connected at the other end thereof to a transmit terminal 9. The second band pass filter 12 is connected at one end thereof to the common terminal 3, and connected at the other end thereof to a receive terminal 10.

The first band pass filter 11 includes a plurality of series arm resonators S1 to S5 and a plurality of parallel arm resonators P1 to P4. An inductor L1 is connected between the parallel arm resonator P1 and the reference potential. End portions at the reference potential side of the parallel arm resonators P2 to P4 are connected in common to the reference potential line 7 via an inductor L2.

The series arm resonators S1 to S5 and the parallel arm resonators P1 to P4 are preferably surface acoustic wave resonators, for example. As illustrated in FIG. 2, the series arm resonator S2 includes two series arm resonators connected in series. The series arm resonator S3 also includes two series arm resonators connected in series. The series arm resonator S5 includes three series arm resonators connected in series.

In FIG. 2, the series arm resonators and the parallel arm resonators are each schematically represented by a cross which is enclosed in a substantially rectangular frame. Surface acoustic wave resonators actually used are preferably, for example, one-port surface acoustic wave resonators that include an IDT electrode on a piezoelectric substrate and reflectors on both sides of the IDT electrode. Acoustic wave devices other than the surface acoustic wave resonators may be used.

The first band pass filter 11 is preferably, for example, a ladder filter including a plurality of surface acoustic wave resonators as described above.

In contrast, the second band pass filter 12 includes first and second longitudinally coupled resonator elastic wave filters 13 and 14 connected in parallel. Both of the first and second longitudinally coupled resonator elastic wave filters 13 and 14 are preferably, for example, five-IDT longitudinally coupled resonator elastic wave filters. Narrow-pitch electrode finger portions are provided between adjacent ones of the five IDTs. The narrow-pitch electrode finger portions have pitches that are narrower than electrode finger pitches in main bodies.

Series arm resonators S11 and S12 and a parallel arm resonator P11 are provided between the node 2 and the first and second longitudinally coupled resonator elastic wave filters 13 and 14 to define and function as a trap. Also, a parallel arm resonator P12 is provided to define and function as a parallel trap between the reference potential line 7 and a common node of the first and second longitudinally coupled resonator elastic wave filters 13 and 14 adjacent to the receive terminal 10.

An impedance matching coil $L_0$ is connected between the node 2 and the reference potential.

In the composite filter device 1, as illustrated in FIG. 2, the shield electrode 5 provides electromagnetic shielding between the signal line 4 connected to the common terminal 3 and the first band pass filter 11. In the present preferred embodiment, the shield electrode 5 is preferably belt-shaped and made of a metal film, for example. Therefore, as in the case of forming an IDT electrode, the shield electrode can be easily formed by patterning a metal film. The shield electrode 5 may be made of another conductive material, and may have a shape other than the belt shape.

The shield electrode 5 is electrically connected to the reference potential line 7. In the present preferred embodiment, as described above, the shield electrode 5 is connected to the reference potential line 7, with the inductor 8 interposed therebetween.

Although not shown in FIG. 2, the inductor 8 is disposed in a multilayer substrate (described below).

Figure 5:
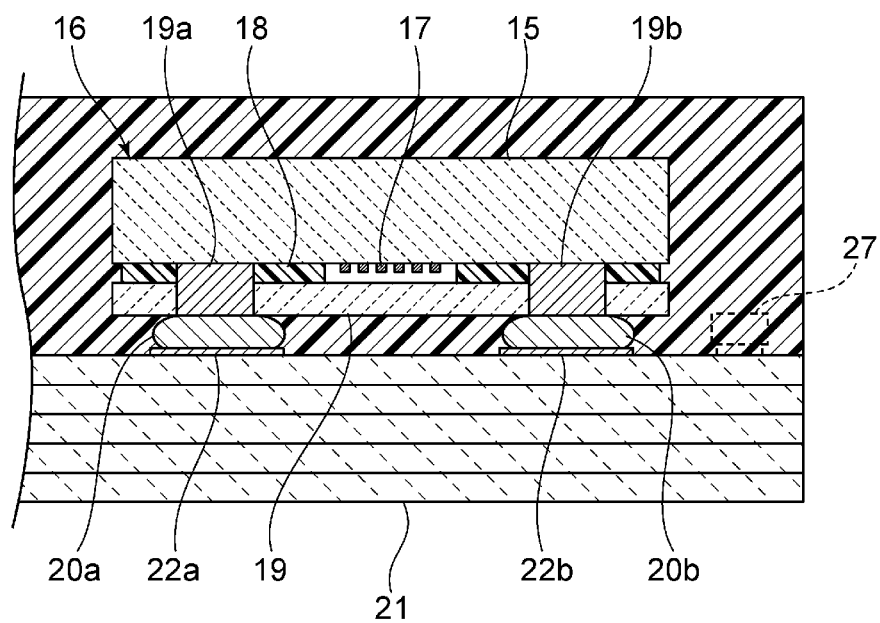
FIG. 5 is a schematic front cross-sectional view of the composite filter device according to the first preferred embodiment of the present invention.

The first and second band pass filters 11 and 12, the shield electrode 5, and the signal line 4 are disposed on an element substrate 15 illustrated in FIG. 5. The element substrate 15 is a piezoelectric substrate in the present preferred embodiment. The element substrate 15 may have any structure that includes a piezoelectric layer. Like a piezoelectric substrate, the entire element substrate 15 may be a piezoelectric layer. The element substrate 15 may have a multilayer structure produced by forming piezoelectric thin films on an insulating substrate, or by forming films of other materials as well as piezoelectric thin films on the insulating substrate. As illustrated in FIG. 5, a filter chip 16 including the element substrate 15 is disposed over a multilayer substrate 21. The filter chip 16 is schematically illustrated in FIG. 5.

In FIG. 5, one acoustic wave resonator portion of the filter chip 16 is shown, which includes an IDT electrode 17 on one principal surface of the element substrate 15. A support layer 18 made of resin is also provided on the one principal surface of the element substrate 15. A cover member 19 is disposed over the support layer 18, and defines a hollow space toward which the IDT electrode 17 faces.

Under-bump metal layers 19a and 19b pass through the support layer 18. The under-bump metal layers 19a and 19b are joined by bumps 20a and 20b to electrode lands 22a and 22b on the multilayer substrate 21. The filter chip 16 including the element substrate 15 is thus mounted on the multilayer substrate 21. By using the bumps 20a and 20b, the element substrate 15 is joined and electrically connected (as described below) to the multilayer substrate 21.

FIGS. 3A to 3C and FIGS. 4A to 4C are schematic plan views illustrating an electrode shape on the upper surface, the second, third, fourth, and fifth layers from the top, and the lower surface of the multilayer substrate 21. Dashed circles in FIGS. 3A to 3C and FIGS. 4A and 4B each indicate a via-hole electrode passing through the corresponding layer and extending downward. For example, in FIG. 3A, the electrode lands 22a and 22b are provided on an upper surface 21a of the multilayer substrate 21. FIG. 5 schematically illustrates an enlarged view of a portion including the electrode lands 22a and 22b.

Note that a portion including electrode lands 22c and 22d is not shown in FIG. 5.

A dashed circle in each of the electrode lands 22a and 22b indicates a via-hole electrode connected to the lower surface of the corresponding one of the electrode lands 22a and 22b.

Figure 3A:
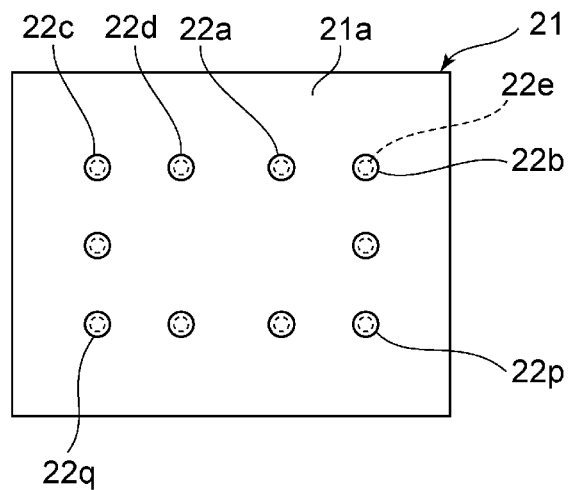
FIGS. 3A to 3C are schematic plan views illustrating an electrode structure on an upper surface and second and third layers of a multilayer substrate included in the first preferred embodiment of the present invention.
Figure 3B:
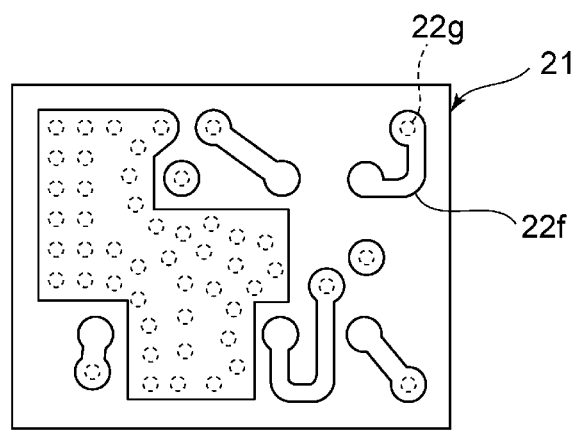
Figure 3C:
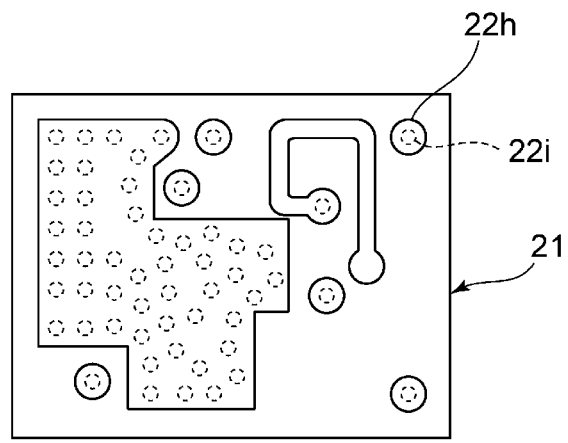
Figure 4A:
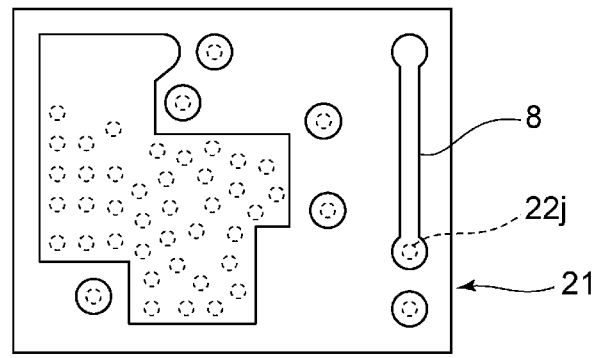
FIGS. 4A to 4C are schematic plan views illustrating the electrode structure on fourth and fifth layers and a lower surface of the multilayer substrate included in the first preferred embodiment of the present invention.
Figure 4B:
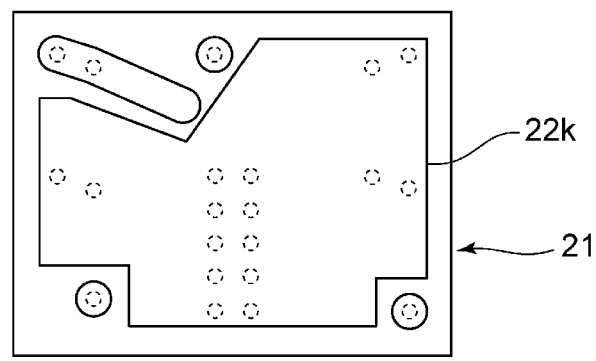
Figure 4C:
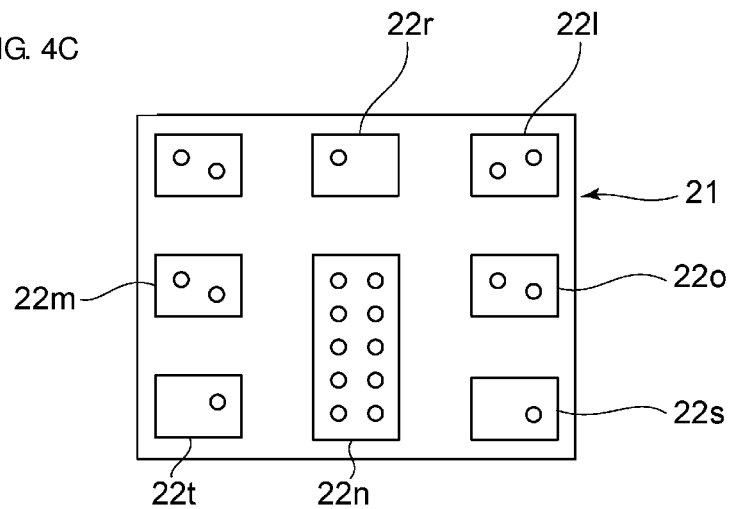

A via-hole electrode 22e is connected to the upper surface of an electrode pattern 22f illustrated in FIG. 3B. A via-hole electrode 22g is connected to the lower surface of the electrode pattern 22f. The via-hole electrode 22g is joined to an electrode pattern 22h illustrated in FIG. 3C. A via-hole electrode 22i is joined to the lower surface of the electrode pattern 22h. The via-hole electrode 22i is electrically connected to an electrode pattern defining the inductor 8 illustrated in FIG. 4A. A via-hole electrode 22j is joined to the lower surface of the inductor 8. The via-hole electrode 22j is connected to an electrode pattern 22k illustrated in FIG. 4B. The electrode pattern 22k is connected to terminal electrodes 22l, 22m, 22n, and 22o in FIG. 4C connected to the reference potential. In FIG. 4C, via-hole electrodes located above the lower surface of the multilayer substrate 21 are indicated by solid lines.

The terminal electrodes 22l, 22m, 22n, and 22o define a portion of the reference potential line 7 illustrated in FIG. 1.

The under-bump metal layer 19b illustrated in FIG. 5 is connected to the shield electrode 5 illustrated in FIG. 1. That is, the under-bump metal layer 19b, the bump 20b, and the electrode land 22b define a portion of the connection line 6 illustrated in FIG. 1.

In FIG. 3A, the electrode land 22a is an electrode land connected to an antenna terminal. An electrode land 22p is connected to a transmit terminal, and an electrode land 22q is connected to a receive terminal. In FIG. 4C, a terminal electrode 22r is connected to an antenna. A transmitter signal is input to terminal electrode 22s. A receiver signal is output from terminal electrode 22t.

Although the inductor 8 is preferably defined by a linear metal pattern, for example, in the present preferred embodiment, the inductor 8 may be a coil inductor, with which the inductance value is more effectively improved. In either case, the inductor 8 may be defined by a metal film in the multilayer substrate 21. An inductor with an optimum inductance value is thus able to be easily provided.

Referring back to FIGS. 1 and 2, with the shield electrode 5 between the signal line 4 and the first band pass filter 11, electromagnetic interference between the signal line 4 and the first band pass filter 11 is able to be reduced or prevented.

However, capacitive coupling is provided between the signal line 4 and the shield electrode 5. Capacitive coupling is also provided between the shield electrode 5 and the series arm resonators S1 to S5 and the parallel arm resonators P1 to P4 of the first band pass filter 11. As illustrated in FIG. 2, since the series arm resonators S1 to S5 are disposed near the shield electrode 5, the capacitive coupling between the shield electrode 5 and the series arm resonators S1 to S5 is particularly strong. Therefore, without the inductor 8, the capacitive coupling causes high-frequency current from the first band pass filter 11 or the signal line 4 to flow into the shield electrode 5 and reach the reference potential line 7. This leakage of the high-frequency current may deteriorate the isolation characteristics between the first band pass filter 11 and the second band pass filter 12.

On the other hand, in the present preferred embodiment in which the inductor 8 is electrically connected between the connection line 6 and the reference potential line 7, the leaking high-frequency current is consumed by the inductor 8. The leaking high-frequency current cannot be fully attenuated by only an inductance between the connection line 6 itself and its reference potential. In the present preferred embodiment, where the inductor 8 is connected, the leaking high-frequency current is able to be sufficiently attenuated. This makes it difficult for high-frequency current to flow into the second band pass filter 12 and thus effectively improves the isolation characteristics.

Although the inductor 8 is preferably provided, for example, by patterning a metal film in the present preferred embodiment, the inductor 8 may be made of a conductive material other than that of the metal film. The inductor may be made of a magnetic material. A chip inductor may be used. For example, like a chip inductor 27 indicated by a dashed line in FIG. 5, a chip inductor may be mounted on the multilayer substrate 21. The chip inductor may be embedded in the multilayer substrate 21 or may be stacked on the element substrate 15.

In the case of providing the inductor outside the multilayer substrate 21, the inductor may be provided on the element substrate 15. It is preferable, however, that the inductor 8 be embedded in the multilayer substrate 21. This makes it possible to improve the isolation characteristics without causing an increase in the size of the composite filter device.

Although a surface acoustic wave device preferably having a wafer level package (WLP) structure, including the element substrate 15, is mounted on the multilayer substrate 21 in the present preferred embodiment, the present invention is not limited to this structure. The composite filter device may be defined by a surface acoustic wave filter device with a different structure. The multilayer substrate 21 does not necessarily need to be used.

Figure 6:
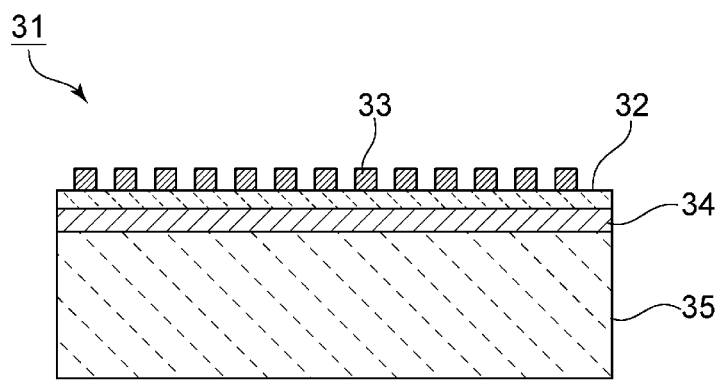
FIG. 6 is a schematic front cross-sectional view of a surface acoustic wave device included in a second preferred embodiment of the present invention.

Like a surface acoustic wave device 31 illustrated in FIG. 6, a structure in which a low-acoustic-velocity film 34 and a high-acoustic-velocity member 35 are stacked in layers on a piezoelectric substrate 32 (which defines and functions as the element substrate) may be used. The low-acoustic-velocity film 34 and the high-acoustic-velocity member 35 are disposed on the surface of the piezoelectric substrate 32 opposite an IDT electrode 33. The low-acoustic-velocity film 34 is made of an appropriate material through which bulk waves propagate at an acoustic velocity lower than that of elastic waves propagating through the piezoelectric substrate 32. The high-acoustic-velocity member 35 is made of a material through which bulk waves propagate at an acoustic velocity higher than that of elastic waves propagating through the piezoelectric substrate 32. In this case, a $LiNbO_3$ substrate, for example, may preferably be used as the piezoelectric substrate 32.

The structure in which the low-acoustic-velocity film and the high-acoustic-velocity member 35 are stacked in layers, as described above, may be used in the composite filter device according to a preferred embodiment of the present invention.

An experimental example will now be described.

A $LiTaO_3$ substrate with Cut-Angles of about 50° was used as the piezoelectric substrate. The $LiTaO_3$ substrate is about 600 nm thick. The piezoelectric substrate includes, on the surface thereof opposite to the IDT electrode, an approximately 670-nm-thick $SiO_2$ film defining and functioning as the low-acoustic-velocity film. An approximately 200-μm-thick Si support substrate defining and functioning as the high-acoustic-velocity member is disposed on the low-acoustic-velocity film.

A multilayer metal film including a Ti film and an AlCu alloy film was used as the IDT electrode. The Ti film is about 12 nm thick, and the AlCu alloy film is an approximately 162-nm-thick AlCu alloy film including 1% of Cu by weight. The IDT electrode is covered with an approximately 25-nm-thick $SiO_2$ film defining and functioning as a protective film. The first and second band pass filters 11 and 12 are configured as in the preferred embodiment described above. Design parameters in the first and second band pass filters 11 and 12 are as follows.

The first band pass filter 11: design parameters of the series arm resonators S1 to S5 and the parallel arm resonators P1 to P4 are as shown in Table 1. In the present experimental example, the series arm resonators S1 to S5 are all surface acoustic wave resonators.

TABLE 1

|  | S1 | P1 | S2 | P2 | S3 | P3 | S4 | P4 | S5 |
|---|---|---|---|---|---|---|---|---|---|
| IDT Wave Length (μm) | 2.0078 | 2.0967 | 2.0283 | 2.1012 | 2.0209 | 2.1004 | 2.024 | 2.0965 | 2.0093 |
| REF Wave Length (μm) | Same as IDT | Same as IDT | Same as IDT | Same as IDT | Same as IDT | Same as IDT | Same as IDT | Same as IDT | Same as IDT |
| Overlap Width (μm) | 37.7 | 74.8 | 35.5 | 76.7 | 16.8 | 27.6 | 30.9 | 46.8 | 47.2 |
| Number of Pairs of Electrode Fingers in IDT | 65 | 60 | 190 | 38 | 257 | 120 | 115 | 110 | 153 |
| Number of | 21 | 21 | 21 | 21 | 21 | 21 | 21 | 21 | 21 |

TABLE 1-continued

|  | S1 | P1 | S2 | P2 | S3 | P3 | S4 | P4 | S5 |
|---|---|---|---|---|---|---|---|---|---|
| Electrode Fingers in Reflector |  |  |  |  |  |  |  |  |  |
| Duty | 0.5 | 0.5 | 0.5 | 0.5 | 0.5 | 0.5 | 0.5 | 0.5 | 0.5 |

Design parameters of the second band pass filter 12:

The first and second longitudinally coupled resonator-type elastic wave filters 13 and 14 have the same design parameters shown in Table 2.

TABLE 2

|  | Wave Length (μm) | IDT Log |
|---|---|---|
| Reflector | 1.9859 | — |
| Main Bodies of 1st and 5th IDTs | 1.9876 | 20.5 |
| Narrow-Pitch Portions of 1st and 5th IDTs | 1.7704 | 1.5 |
| Narrow-Pitch Portions (on 1st and 5th IDT Sides) of 2nd and 4th IDTs | 1.8334 | 1.0 |
| Main Bodies of 2nd and 4th IDTs | 1.9391 | 12.5 |
| Narrow-Pitch Portions (on 3rd IDT Sides) of 2nd and 4th IDTs | 1.876 | 3.5 |
| Narrow-Pitch Portions of 3rd IDT | 1.8971 | 4.0 |
| Main Body of 3rd IDT | 1.9694 | 17.0 |

Duties in the first and second longitudinally coupled resonator elastic wave filters 13 and 14 are about 0.5 in both the reflector and the IDT. The distance between the IDT and the reflector is about $0.53\lambda_R$. Note that $\lambda_R$ is a wave length determined by the electrode finger pitch of the reflector.

The number of electrode fingers of the reflector is 30.

Design parameters of the series arm resonators S11 and S12 and the parallel arm resonators P11 and P12 in FIG. 1 are as shown in Table 3.

TABLE 3

|  | S11 | P11 | S12 | P12 |
|---|---|---|---|---|
| IDT Wave Length (μm) | 1.9107 | 1.9806 | 1.9 | 1.9745 |
| REF Wave Length (μm) | Same as IDT | Same as IDT | Same as IDT | Same as IDT |
| Overlap Width (μm) | 22.2 | 54.1 | 26.1 | 22.5 |
| Number of Pairs of Electrode Fingers in IDT | 91 | 65 | 232 | 64 |
| Number of Electrode Fingers in Reflector | 21 | 21 | 21 | 21 |
| Duty | 0.5 | 0.5 | 0.5 | 0.5 |

Figure 7:
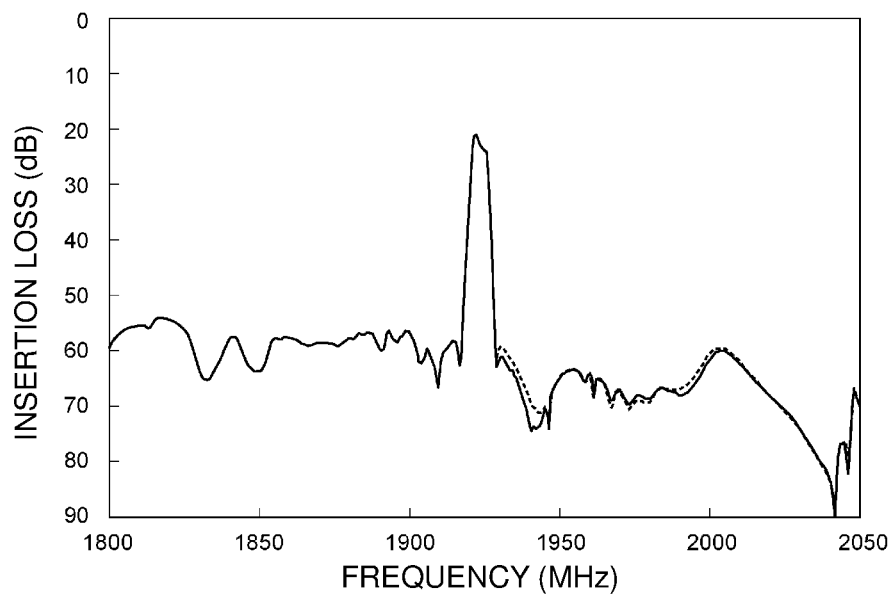
FIG. 7 is a diagram showing isolation characteristics of the composite filter device according to the first preferred embodiment of the present invention.
Figure 8:
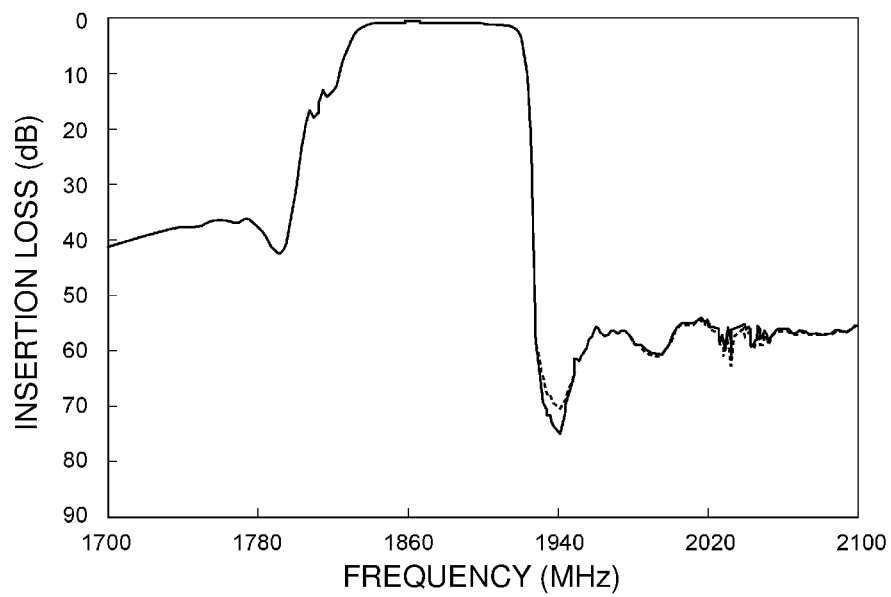
FIG. 8 is a diagram showing an attenuation-frequency characteristic of a transmit filter of the composite filter device according to the first preferred embodiment of the present invention.
Figure 9:
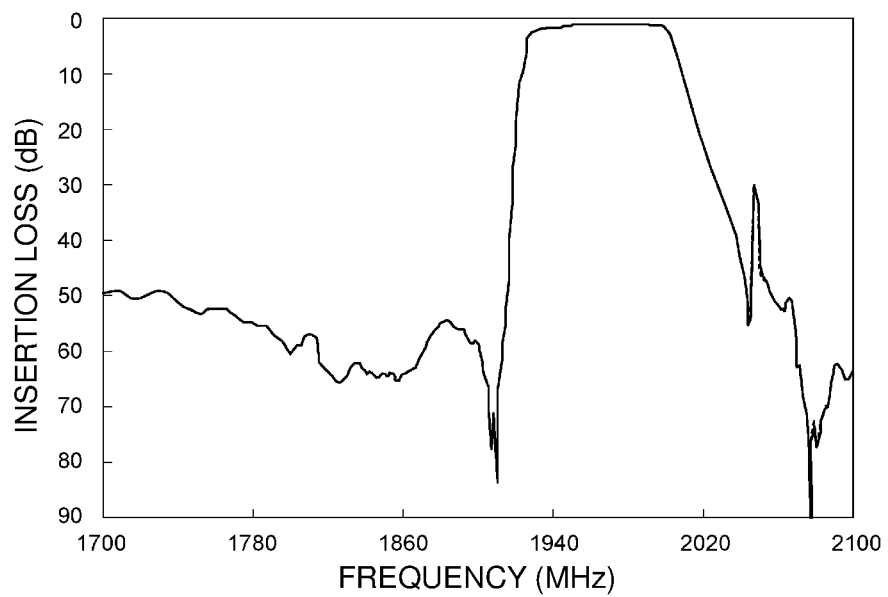
FIG. 9 is a diagram showing an attenuation-frequency characteristic of a receive filter of the composite filter device according to the first preferred embodiment of the present invention.

The isolation characteristics of the composite filter device 1 made as described above is shown in FIG. 7, the attenuation-frequency characteristic of the first band pass filter 11 serving as a transmit filter is shown in FIG. 8, and the attenuation-frequency characteristic of the second band pass filter 12 defining and functioning as a receive filter is shown in FIG. 9. For comparison, the isolation characteristics of a composite filter device made in the same or substantially the same manner as the present preferred embodiment, except that it does not include the inductor 8 is indicated by a dashed line in FIG. 7, and the attenuation-frequency characteristics of first and second band pass filters of this composite filter device are each indicated by a dashed line in the corresponding one of FIGS. 8 and 9.

As is apparent from FIG. 7, in the present experimental example, the isolation characteristics are improved more effectively than with the composite filter device of the comparative example. As is apparent from FIGS. 8 and 9, the filter characteristics of the first and second band pass filters 11 and 12 in this case remain substantially unchanged. That is, the isolation characteristics are effectively improved without deteriorating the filter characteristics.

Figure 10:
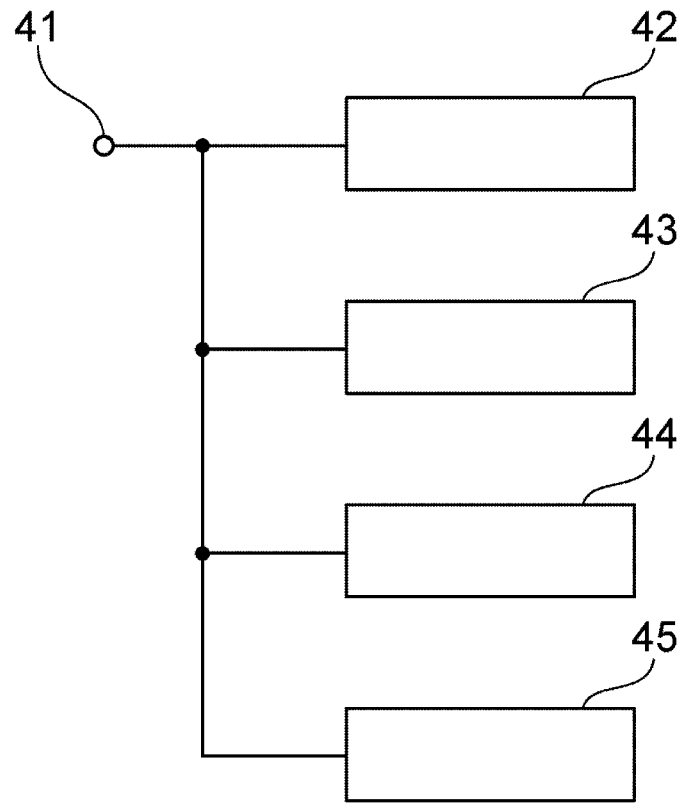
FIG. 10 is a block diagram illustrating a modification of the composite filter device according to a preferred embodiment of the present invention.

Although the foregoing preferred embodiments relate to a duplexer that includes the first band pass filter 11 defining and functioning as a transmit filter and the second band pass filter 12 defining and functioning as a receive filter, the composite filter device of the present invention is not limited to this structure. For example, as illustrated in FIG. 10, the composite filter device may be a composite filter device for carrier aggregation in which first to fourth band pass filters 42 to 45 are connected to a common terminal 41. In this case, the first and second band pass filters 42 and 43 may be transmit filters for any Band, or may even be receive filters.

Although preferably, for example, the first band pass filter 11 is a ladder filter and the second band pass filter 12 includes the first and second longitudinally coupled resonator elastic wave filters 13 and 14 in the preferred embodiments described above, the configuration of the elastic wave filters is not limited to this structure. The second band pass filter 12 may also be a ladder filter, or the first band pass filter 11 may include longitudinally coupled resonator elastic wave filters.

The composite filter devices according to preferred embodiments of the present invention may be a filter device of any type that includes first and second band pass filters connected to an antenna common terminal. This means that the composite filter device may be a duplexer, a multiplexer, a dual filter, or other suitable device, for example, and may be used in a carrier aggregation circuit, a high-frequency front end module, and a communication apparatus, such as a cellular phone or a smartphone, for example.

Figure 11:
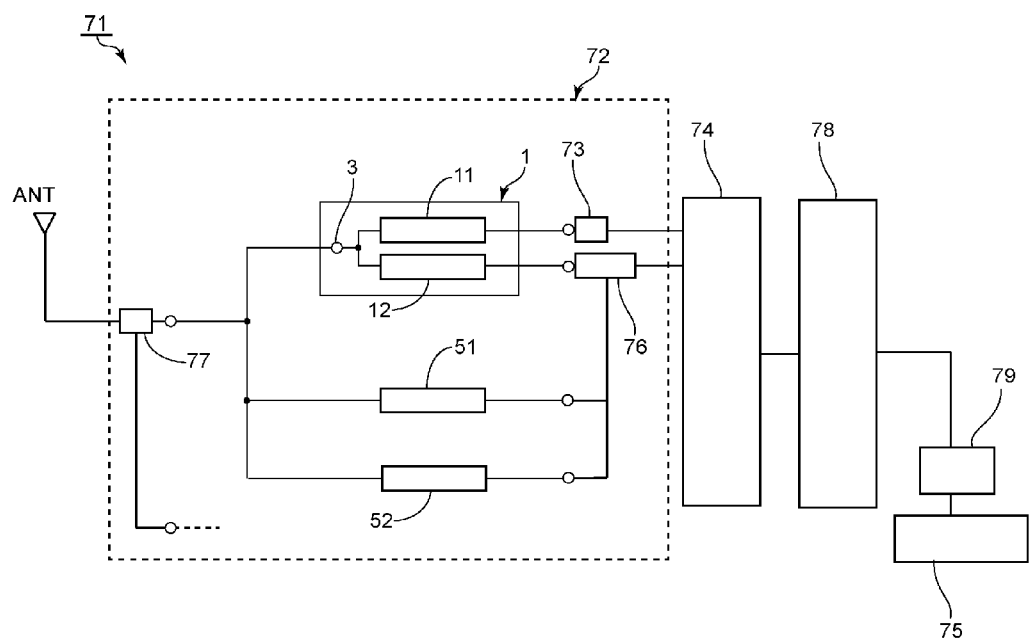
FIG. 11 is a schematic circuit diagram of a composite filter device, a high-frequency front end circuit, and a communication apparatus according to a preferred embodiment of the present invention.

FIG. 11 is a schematic circuit diagram of a composite filter device, a high-frequency front end circuit, and a communication apparatus according to a preferred embodiment of the present invention.

As illustrated in FIG. 11, a high-frequency front end circuit 72 includes the composite filter device 1 described above and receive filters 51 and 52. A power amplifier 73, a low-noise amplifier (LNA) 76, and a switch (SW) 77 are connected to the composite filter device 1 and the receive filters 51 and 52.

The high-frequency front end circuit 72 may preferably include, for example, a diplexer, a circulator, or an isolator.

As illustrated in FIG. 11, a communication apparatus 71 is preferably, for example, a cellular phone, a smartphone, or a car-mounted communication apparatus or a communication apparatus for healthcare, and includes an RFIC 74 which is an IC for an RF stage, a base band IC (BBIC) 78, a CPU 79, and a display 75.

The power amplifier 73 and the LNA 76 are connected to the RFIC 74. The base band IC (BBIC) 78 is also connected to the RFIC 74.

The high-frequency front end circuit 72 and the communication apparatus 71 thus include the composite filter device 1 described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
an element substrate including a piezoelectric layer;
a common terminal disposed on the element substrate;
a first band pass filter connected at one end thereof to the common terminal, disposed on the element substrate, and including an acoustic wave resonator;
a second band pass filter connected at one end thereof to the common terminal, disposed on the element substrate, and including an acoustic wave resonator;
a signal line disposed on the element substrate and connecting the one end of each of the first and second band pass filters to the common terminal;
a reference potential line disposed on the element substrate and connected to the second band pass filter;
a shield electrode disposed on the element substrate, interposed between the signal line and the first band pass filter, and electrically connected to the reference potential line;
an inductor electrically connected between the shield electrode and the reference potential line; and
the signal line is disposed opposite to the second band pass filter, with the first band pass filter interposed therebetween.

2. The composite filter device according to claim 1, wherein the first band pass filter includes a plurality of acoustic wave resonators.

3. The composite filter device according to claim 2, wherein the plurality of acoustic wave resonators include series arm resonators and parallel arm resonators, and the first band pass filter is a ladder filter.

4. The composite filter device according to claim 1, wherein the shield electrode is belt-shaped and made of a metal film.

5. The composite filter device according to claim 1, further comprising:
a multilayer substrate; wherein
the element substrate including the first and second band pass filters thereon is mounted on the multilayer substrate.

6. The composite filter device according to claim 5, wherein the inductor is located in the multilayer substrate.

7. The composite filter device according to claim 1, wherein the inductor includes a metal film.

8. The composite filter device according to claim 1, wherein the inductor is a chip inductor.

9. The composite filter device according to claim 6, further comprising:
a plurality of bumps joining the element substrate to the multilayer substrate; wherein
the shield electrode is connected to at least one of the plurality of bumps that is connected to the inductor in the multilayer substrate.

10. The composite filter device according to claim 1, wherein the common terminal is an antenna terminal.

11. The composite filter device according to claim 10, wherein one end of at least one other band pass filter is connected to the common terminal to define a composite filter device for carrier aggregation.

12. The composite filter device according to claim 10, wherein the first band pass filter and the second band pass filter define and function as a transmit filter and a receive filter, respectively, to define a duplexer.

13. A high-frequency front end circuit comprising:
the composite filter device according to claim 1; and
at least one of a switch, a power amplifier, an LNA, a diplexer, a circulator, and an isolator.

14. The high-frequency front end circuit according to claim 13, wherein the first band pass filter includes a plurality of acoustic wave resonators.

15. The high-frequency front end circuit according to claim 14, wherein the plurality of acoustic wave resonators include series arm resonators and parallel arm resonators, and the first band pass filter is a ladder filter.

16. The high-frequency front end circuit according to claim 13, wherein the shield electrode is belt-shaped and made of a metal film.

17. The high-frequency front end circuit according to claim 13, further comprising:
a multilayer substrate; wherein
the element substrate including the first and second band pass filters thereon is mounted on the multilayer substrate.

18. A communication apparatus comprising:
the high-frequency front end circuit according to claim 13; and an RFIC.

* * * * *